United States Patent [19]

Aslan

[11] Patent Number: 5,266,888
[45] Date of Patent: Nov. 30, 1993

[54] WIDE POWER RANGE RADIATION MONITOR

[75] Inventor: Edward E. Aslan, Plainview, N.Y.

[73] Assignee: The Narda Microwave Corp., Hauppauge, N.Y.

[21] Appl. No.: 843,544

[22] Filed: Feb. 28, 1992

[51] Int. Cl.⁵ .................... G01R 21/06; G01R 15/08; G01R 19/22
[52] U.S. Cl. .................. 324/95; 324/115; 324/119
[58] Field of Search ............... 324/95, 130, 132, 142, 324/115, 116, 141, 123 R, 119; 329/366

[56] References Cited

U.S. PATENT DOCUMENTS

| | | | |
|---|---|---|---|
| 1,447,793 | 3/1923 | Latour | 329/366 |
| 2,296,092 | 9/1942 | Crosby | 329/366 |
| 3,652,934 | 3/1972 | Paljug et al. | 324/115 |
| 3,822,401 | 7/1974 | Parker | 324/115 |
| 4,200,933 | 4/1980 | Nickel et al. | 324/130 |
| 4,255,706 | 3/1981 | Soojiam | 324/132 |
| 4,263,653 | 4/1981 | Mecklenberg | 324/95 |
| 4,329,641 | 5/1982 | Ikeda et al. | 324/115 |
| 4,341,994 | 7/1982 | Kawasaki et al. | 324/95 |
| 4,364,027 | 12/1982 | Murboka | 324/130 |
| 4,392,108 | 7/1983 | Hopfer | 324/95 |
| 4,605,905 | 8/1986 | Aslan . | |
| 4,611,166 | 9/1986 | Aslan . | |
| 4,634,968 | 1/1987 | Aslan . | |
| 4,692,693 | 9/1987 | Rabeyrolles | 324/115 |
| 4,752,730 | 6/1988 | Aslan . | |
| 4,789,824 | 12/1988 | Henkelmann | 324/115 |
| 4,897,599 | 1/1990 | Koslar | 324/130 |
| 4,943,764 | 7/1990 | Szente et al. . | |
| 4,970,456 | 11/1990 | Holcomb et al. | 324/132 |
| 5,059,896 | 10/1991 | Germer et al. | 324/141 |

*Primary Examiner*—Ernest F. Karlsen
*Attorney, Agent, or Firm*—Hoffmann & Baron

[57] ABSTRACT

A wide power range radiation monitor includes a pair of diodes with their cathodes interconnected and with an additional capacitor coupled in parallel to one of the diodes. The detector of the radiation monitor provides two outputs, a low power output and a high power output, which outputs are connected to the anodes of the detector diodes. The arrangement of dual diodes and capacitance provide the diode detector of the monitor with a greater than 40 dB square law region.

10 Claims, 4 Drawing Sheets

MID BAND (5-27 MHz)

BELOW 5 MHz

ABOVE 27 MHz

WIDE POWER RANGE RADIATION MONITOR

BACKGROUND OF THE INVENTION

1. Field of the Invention

This invention relates to radiation monitors and more particularly to measuring instruments suitable for monitoring radiation of electric fields over a wide power range.

2. Description of the Prior Art

Diode detectors have been commonly used in radiation monitors to measure RF power or power density or field strength. An example of such is disclosed in U.S. Pat. No. 4,634,968 which issued on Jan. 6, 1987 to the inventor.

Such diode detectors exhibit a square law region. It is essential to operate the detector in the square law region for true RMS detection. True RMS operation is required to make accurate measurements when multiple signals, modulated signals and isotropic performance are involved.

A problem with convention diode detectors is that they exhibit a square law region only up to a maximum power of between about 20 and about 30 db. This limits the maximum power range over which the radiation monitor may operate.

OBJECTS AND SUMMARY OF THE INVENTION

It is an object of the present invention to provide a radiation monitor operable over a wide power range.

It is another object of the present invention to provide a radiation monitor employing a diode detector having an extended square law region.

It is yet another object of the present invention to provide a radiation probe having an isotropic response over a wide power range and being operable over a specified wide frequency band.

It is yet a further object of the present invention to overcome the inherent disadvantages of known diode detector radiation monitors.

In one form of the present invention, a diode detector for use in a radiation monitor includes dual diodes, connected cathode-to-cathode. More specifically, the diode detector includes a first and second diode which have their cathodes interconnected and to ground. Each diode has an intrinsic shunt capacitance associated with it. An additional capacitor is connected in parallel with one of the diodes (for example, the first diode) to ensure that the total shunt capacitance of the first diode is greater than that of the second diode, thereby resulting in a reduction in sensitivity of the first diode caused by the unequal capacitive divider formed by the diode shunt capacitances. This particular configuration splits the total dynamic range of the detector between the two diodes.

A radiation monitor employing the dual diode detector described above includes a pair of amplifiers, one amplifier being connected to the anode of one diode and the other amplifier being connected to the anode of the other diode. Each amplifier is preferably an instrumentation amplifier having commutating auto-zero and temperature offset compensation.

The radiation monitor also includes a comparator circuit which selects the appropriate diode output signal based upon the level of at least one of the signals. The output signal selected by the comparator circuit is provided to a temperature sensitivity compensation circuit, whose output signal in turn is preferably provided to a square root circuit.

The output signal of the square root circuit is preferably provided to an adjustable attenuation circuit so that the output signal from the radiation monitor will be linear over the full dynamic range of the monitor.

These and other objects, features and advantages of the present invention will be apparent from the following detailed description of illustrative embodiments thereof, which is to be read in connection with the accompanying drawings.

DETAILED DESCRIPTION OF THE PREFERRED EMBODIMENTS

Figure 1:
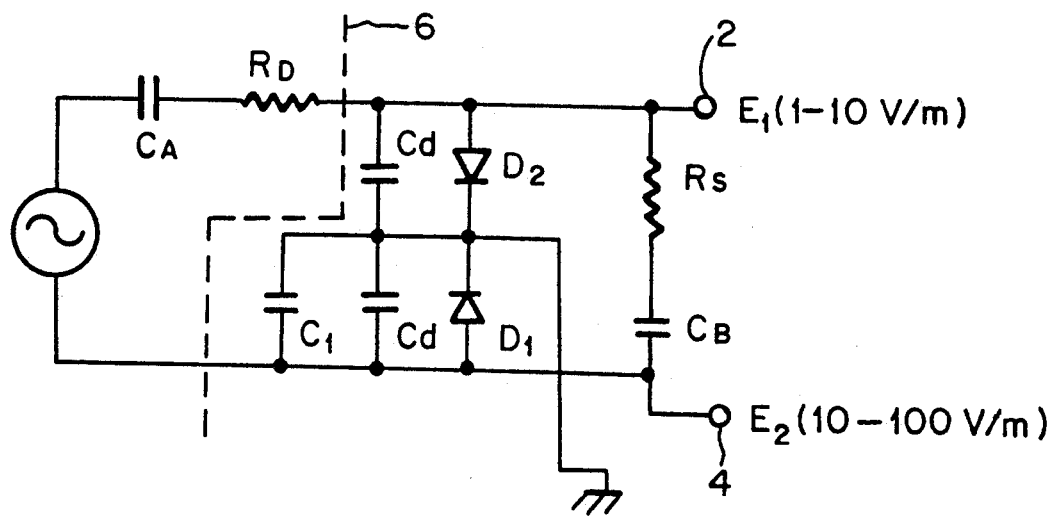
FIG. 1 is a lumped equivalent circuit of the diode detector of the present invention.

Referring initially to FIG. 1 of the drawings, it will be seen that a diode detector formed in accordance with the present invention includes dual diodes with their cathodes interconnected to a common or ground. More specifically, the detector of the present invention includes a first diode D1 and a second diode D2. The detector has a low power output 2, which is coupled to the anode of the second diode D2, and a high power output 4 which is connected to the anode of the first diode D1.

In one specific embodiment of the invention, the first and second diodes are schottky diodes formed on a single integrated circuit or individual diodes, for example, Part No. HP5082-2800 manufactured by Hewlett-Packard Co.

Each diode has an intrinsic shunt capacitance $C_d$, as shown in FIG. 1. Since each diode D1, D2 is preferably the same, each has substantially the same shunt capacitance $C_d$.

An additional capacitor C1 is connected in parallel with the first diode D1 to thereby increase the total shunt capacitance of the diode (thereby lowering the reactance). It is preferred if the total shunt capacitance (i.e., $C_d + C1$) of the first diode D1 is about ten times that of the second diode D2. This results in about a 20 dB reduction in the sensitivity of the first diode D1 to the received electric field E. Each of the first and second diodes operates over a 20 dB operating range so that the total applied signal covers a 40 dB range of operation.

The diode detector of the present invention shown in FIG. 1 has a greater than 40 dB square law region. This is achieved with the dual diode configuration and the approximately 10:1 ratio between the shunt capacitances of the diodes to split the range between the first and second diodes.

For isotropic performance, a dipole antenna is used for the radiation monitor and connected to the diode detector. Preferably, the dipole antenna is selected so that it is a small fraction of the wavelength of the expected signal. As such, it is represented in FIG. 1 as only a capacitance $C_A$ and interconnected dipole resistance $R_D$ to the left of dashed line 6.

The electric field E received by the antenna to which the dual diode detector is coupled is effectively divided proportionally across diodes D1, D2 in correspondence with the capacitive divider formed by the second diode's shunt capacitance Cd and the first diode's total shunt capacitance (Cd+C1). With an approximately 10:1 ratio between the shunt capacitances of diode D1 and diode D2, only approximately 10% of the electric field E is provided to the first diode D1. Therefore, for an electric field of 1-100 V/m, for example, the second diode D2 can operate in its 20 dB square law region and provide an output voltage signal on detector output 2 that corresponds to an input field strength of 1-10 V/m, and the first diode D1 can operate in its 20 dB square law region and provide an output voltage signal on detector output 4 that corresponds to an input field strength of 10-100 V/m.

The diode detector further preferably includes a shunt resistor $R_S$ connected in series with a bypass capacitor $C_B$. The series arrangement of the shunt resistor $R_S$ and bypass capacitor $C_B$ is electrically coupled between the anode of the first diode D1 and the anode of the second diode D2. Bypass capacitor $C_B$ is provided to prevent the DC shorting of diodes D1, D2, and together capacitor $C_B$ and shunt resistor $R_S$ help shape the frequency response of the detector to limit out of band responses.

Typical component values of the diode detector to obtain a 40 dB range in performance are set forth in the following table:

TABLE 1

| Component | Value |
| --- | --- |
| $R_D$ | 60K ohms |
| $C_A$ | .1 pf |
| Cd | 2 pf |
| C1 | 18 pf |
| $R_S$ | 10K ohms |
| $C_B$ | greater than 200 pf |

With these values, the diode detector of the radiation monitor has a greater than 40 dB square law region. The low power output 2 of the diode detector will provide an output signal corresponding from about 1 to about 10 V/m in input field strength, and the high power output 4 will provide an output signal corresponding from about 10 to about 100 V/m in input field strength. Also with these values, the diode detector is operational from about 2 MHz to about 30 MHz.

Figure 2:
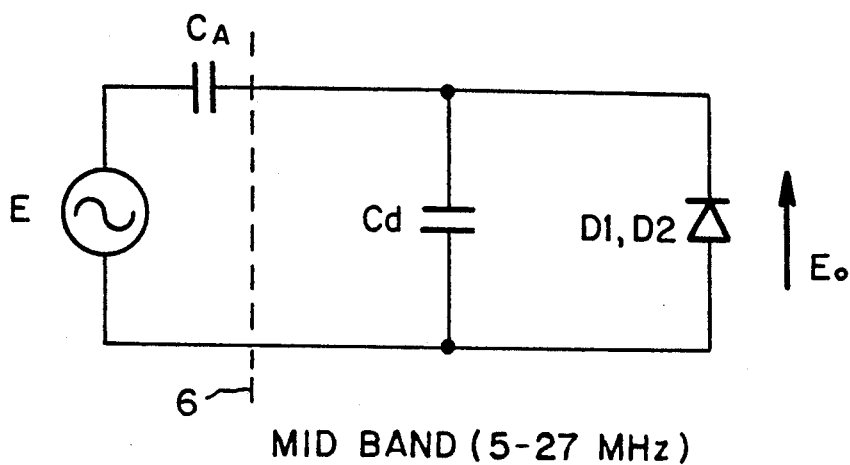
FIG. 2 is a lumped equivalent circuit of the diode detector of the present invention at midband.
Figure 3:
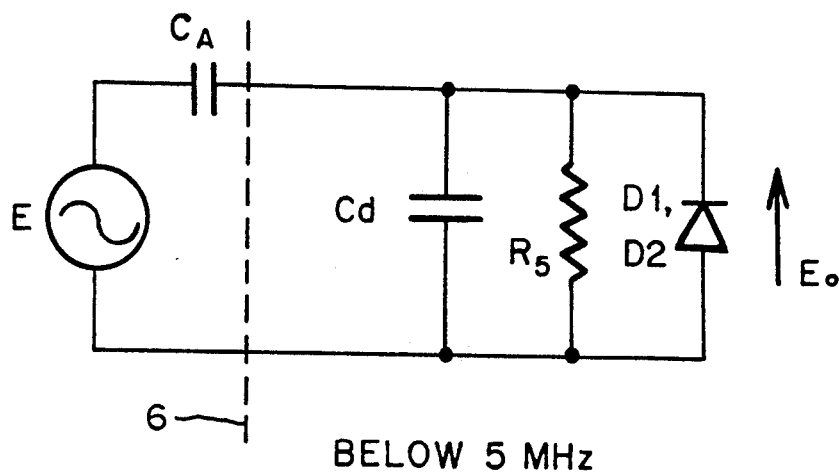
FIG. 3 is a lumped equivalent circuit of the diode detector at the low end of the detector's operating band.
Figure 4:
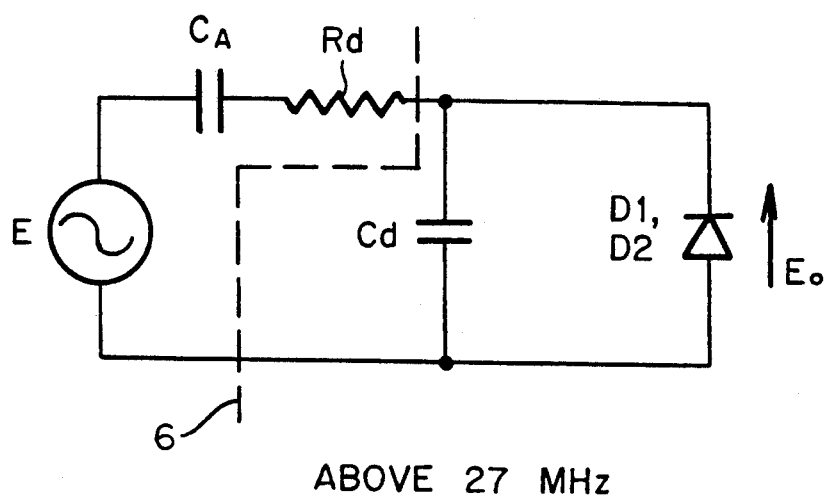
FIG. 4 is a lumped equivalent circuit of the diode detector at the high end of the detector's operating band.

FIGS. 2-4 respectively represent lumped equivalent circuits of the diode detector shown in FIG. 1 at midband, below 5 MHz and above 27 MHz. The dual diode configuration is represented as a single diode in the following description of the bandwidth control of the detector.

In the midband region, as shown in FIG. 2, the dipole and diode function as a capacitive divider with a response independent of frequency. This is because shunt resistor $R_S$ is much greater than the reactance of bypass capacitor $C_B$ as well as the total reactance of the rest of the circuit; therefore, resistor $R_S$ is effectively out of the circuit.

In the region below about 5 MHz (see FIG. 3), the shunt resistor $R_S$ placed across the diode becomes significant relative to the reactance of the diode capacitance Cd. This causes the response to fall at 6 dB per octave.

At above about 27 MHz, the shunt resistor $R_S$ becomes insignificant relative to the reactance of the diode capacitance Cd, and the shunt resistor $R_S$ is effectively out of the circuit. The dipole and diode function as a voltage divider between dipole resistance $R_D$ and shunt capacitance Cd. The reactance of dipole capacitance $C_A$ is insignificant to dipole resistance $R_D$ at this frequency. The frequency response falls at 6 dB per octave.

It should be noted that in the above description of the lumped equivalent circuits, the diode shunt capacitance referred to is equal to capacitance Cd, when referring to the second diode D2, or the total of capacitance Cd and capacitance C1, when referring to the first diode D1.

Figure 5:
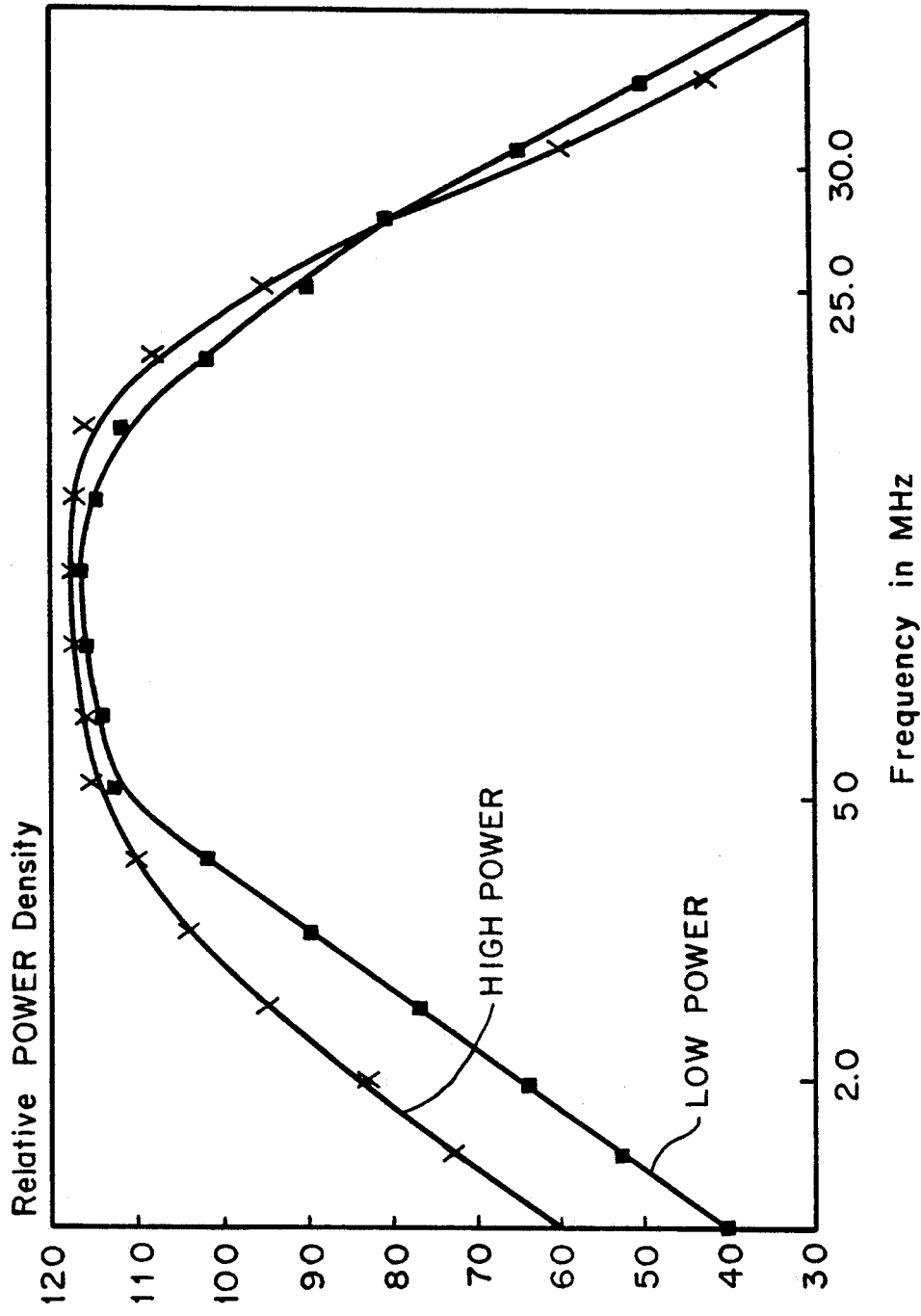
FIG. 5 is a graph plotting the sensitivity of the diode detector of the present invention as a function of frequency.

FIG. 5 is a graph illustrating the response of one form of the diode detector over frequency. The low power response from diode D2 and the high power response from diode D1 are shown in FIG. 5 and so designated. It should be noted that the frequency response of the detector at midband is relatively flat over about a 20 MHz region, and with a 6 db per octave rolloff, provides 30 db of attenuation at the low and high end of the operating range, that is, at below about 2 and above about 27 MHz.

Figure 6:
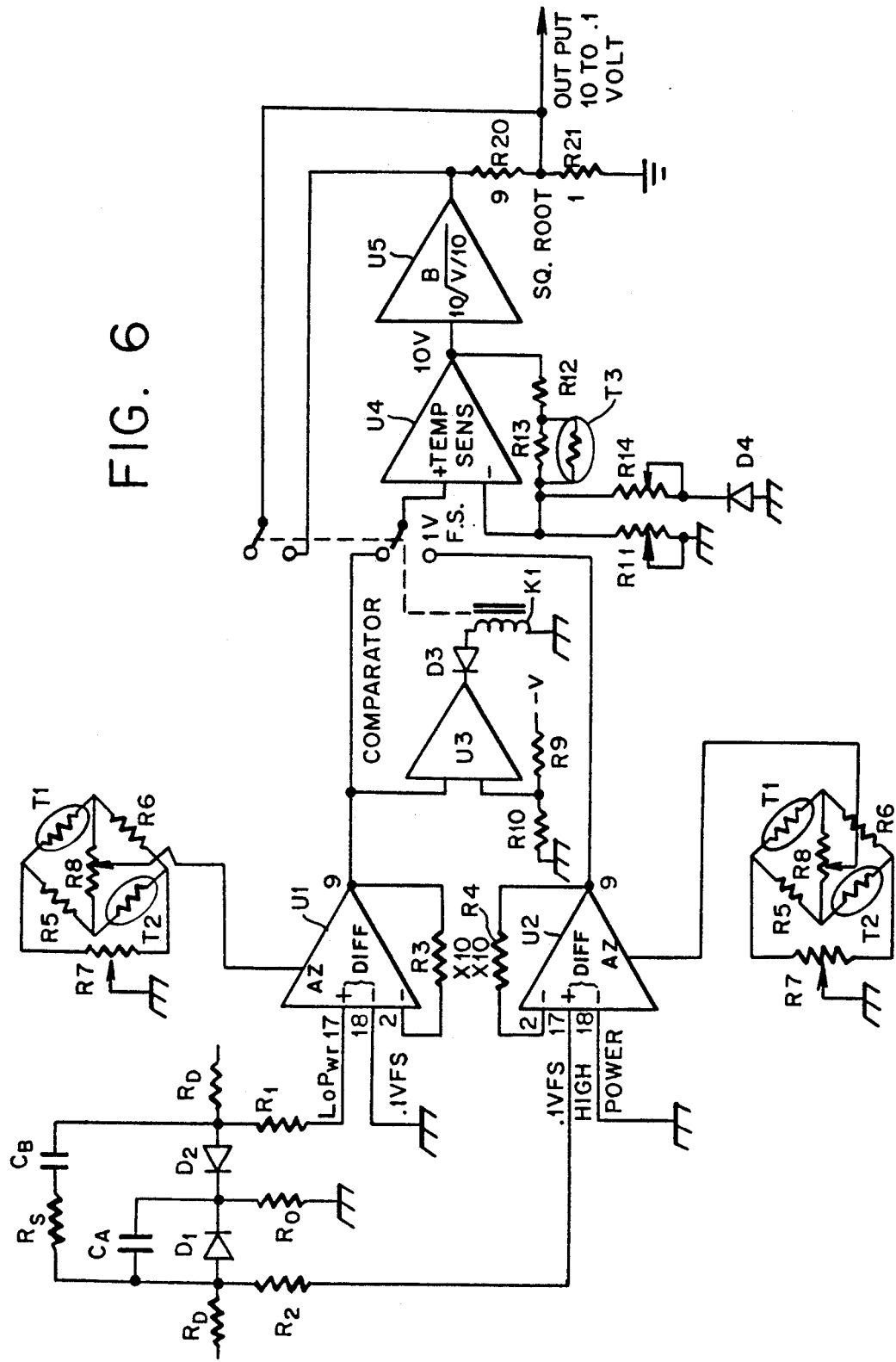
FIG. 6 is a schematic of a radiation monitor incorporating the dual diode detector and formed in accordance with the present invention.

A preferred form of a radiation monitor or probe incorporating the diode detector described previously is shown schematically in FIG. 6. The diode detector is connected to two operational amplifiers U1, U2, which are preferably commutating auto-zero instrumentation amplifiers, such as Part No. ICL 7605 manufactured by Intersil, Inc. More specifically, the low power output 2 of the diode detector is connected to the non-inverting differential input (Pin 17) of amplifier U1, and similarly, the high power output 4 of the diode detector is connected to the non-inverting differential input (Pin 17) of amplifier U2. The low power and high power outputs of the detector are connected to amplifiers U1, U2 through a transparent transmission line, the impedance of which is illustrated as resistors R1 and R2, and R0 to common or ground. The inverting inputs (Pin 18) of amplifiers U1 and U2 are grounded. Each amplifier U1, U2 includes a feedback resistor R3, R4 connected between its respective output and its non-differential inverting input (Pin 2). Resistors R3 and R4 are selected so that each of amplifiers U1, U2 provides a gain of 10.

Each of the amplifiers U1, U2 has associated with it an auto-zero and temperature offset compensation circuit. Each compensation circuit includes a pair of thermistors T1, T2 connected in a bridge configuration with bridge resistors R5, R6. The junction between thermistor T1 and resistor R5 and thermistor T2 and resistor R6 are respectively coupled to the legs of potentiometer R7, whose wiper is connected to ground. The junction between thermistor T1 and resistor R6 and thermistor T2 and resistor R5 are respectively connected to the opposite legs of potentiometer R8, whose wiper is coupled to the auto-zero(AZ) input of the respective amplifier U1, U2. Potentiometer R7 is adjusted at ambient temperature for zero voltage offset, and potentiometer R8 is adjusted for zero offset at the elevated temperature. Once adjusted, thermistors T1, T2 in the bridge configuration maintain the balanced temperature compensation. The bridge circuit is described in U.S. Pat. No. 4,605,905, which issued to the inventor on Aug. 12, 1986, the disclosure of which is incorporated herein by reference.

The amplifier U1, U2 are coupled to a low power and high power output selection circuit comprising a comparator circuit U3, and a relay K1. More specifically, the outputs of amplifiers U1, U2 are provided to the poles of one switching circuit of relay K1. The wiper of the associated switching circuit of relay K1 is connected to the non-inverting input of a third operational amplifier U4, which is used for temperature compensation and will be described in detail.

The output of amplifier U1 is also connected to one input of the comparator U3, whose other input is connected to a negative reference voltage through a voltage divider formed from the combination of a series connection of resistors R9 and R10 (i.e., resistors R9 and R10 are connected together between a negative voltage and ground). The output of the comparator is connected to the cathode of diode D3, whose anode is connected to one end of the relay coil, whose other end is grounded.

Relay K1 is shown in FIG. 5 as being in the unenergized position. If the magnitude of the voltage on the output of amplifier U1 (i.e., the low power output of the diode detector) is less than that of the reference voltage, relay K1 will remain unenergized, and the output signal from amplifier U1 will be provided to the input of temperature compensating amplifier U4. If, on the other hand, the magnitude of the output signal of amplifier U1 equals or exceeds the magnitude of the reference voltage provided to comparator U3, the comparator will change state and cause relay K1 to be energized. Relay K1 will, in turn, change state, allowing the output signal from amplifier U2 (i.e., corresponding to the high power output signal from the diode detector) to pass through the relay switching circuit to the input of temperature compensating amplifier U4.

Amplifier U4 includes an input resistor R11 in the form of a potentiometer connected between the inverting input and ground. Connected between the output and the inverting input of amplifier U4 for feedback is resistor R12 in series with the parallel arrangement of resistor R13 and thermistor T3. Potentiometer R11 is used to adjust the gain of amplifier U4 (which preferably has a gain of 10), and thermistor T3 is used for temperature compensation.

Amplifier U4 may also include a potentiometer R14 having one end connected to the inverting input and the wiper and other end connected to the cathode of a diode D4, whose anode is connected to ground. Potentiometer R14 and diode D4 are used for shaping the signal selected by comparator U3 to correct for non-linearities in the detector diode's response.

The circuit of the radiation monitor may also include a square root circuit U5. More specifically, the output signal from temperature compensation amplifier U4 is provided to the input of square root circuit U5. Circuit U5 takes the square root of the output signal from temperature compensation amplifier U4, and provides an output signal which is a voltage that is proportional to the input electric field strength, i.e., in V/m. This is because the high power and low power signals from the diode detector provided to the amplifiers U1, U2 are negative voltages of preferably between about 0.01 and 0.1 volts, which voltage corresponds to volts squared per meter squared due to the square law effect of diodes D1, D2. Square root circuit U5 provides an output voltage signal which corresponds to volts per meter. A suitable integrated circuit for use as square root circuit U5 is Part No. 4302 manufactured by Burr-Brown Corp.

The output of square root circuit U5 is provided to an attenuating circuit. The attenuating circuit is basically a resistor divider network comprising the series connection of resistor R20 and resistor R21. One end of resistor R20 is coupled to the output of square root circuit U5, and the other end of resistor R21 is connected to ground. The output of the radiation monitor is taken from the junction of resistors R20, R21.

The values of resistors R20, R21 are selected to be in the ratio of 9:1, respectively. Also, the opposite ends of resistor R20 are connected between the wiper and the normally open pole of a second switching circuit in relay K1.

When relay K1 is unenergized, as shown in FIG. 5, the output signal from square root circuit U4 passes through resistor R20, and the output of the radiation monitor is equal to one tenth of the output signal of circuit U5. However, when relay K1 changes state, the second switching circuit shorts out resistor R20 so that there is no attenuation of the output signal from square root circuit U5 and so that the output signal from the radiation monitor equals the output signal from the square root circuit U5.

The diode detector of the present invention provides operation over a relatively wide power range. The radiation monitor incorporating the diode detector of the present invention has a square law region which is greater than 40 dB, which is much greater than conventional diode detector radiation monitors. The radiation monitor of the present invention is temperature and offset voltage compensated, and provides a linear output voltage which, as described above, may correspond to an input field strength of between about 1 and about 100 V/m.

In its preferred form, the circuitry and diode detector of the radiation monitor may be housed in a probe enclosure, and the temperature of the probe enclosure may be maintained at an elevated constant temperature by a thermostatically controlled heater (not shown). The dipole antenna provides isotropic performance over a specified bandwidth.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. An electromagnetic field radiation monitor, which comprises:
a diode detector, the diode detector receiving an input signal corresponding to a received electromagnetic field, the diode detector having first and second diodes, each of the first and second diodes having an anode and a cathode and having a shunt capacitance, the cathodes of the first and second diodes being interconnected, the diode detector further including a first capacitor, the first capacitor being connected in parallel with the first diode, the total capacitance of the parallel combination of the first capacitor and the first diode being greater than the shunt capacitance of the second diode, the shunt capacitance of the first and second diodes in combination with the first capacitor defining a capacitive divider, the received electromagnetic field input signal being provided to the anodes of the first and second diodes and being divided proportionally across the first and second diodes in correspondence with the capacitive divider, the diode detector having a first output coupled to the anode of the second diode and generating a low power output signal thereon, and a second output coupled to the anode of the first diode and providing a high power output signal thereon;

a low and high power output signal selection circuit, the selection circuit being coupled to the diode detector and receiving at least one of the low power output signal and the high power output signal from the diode detector, the selection circuit comparing the at least one output signal with a predetermined threshold signal and providing an output signal corresponding to one of the low power output signal and the high power output signal in response to the comparison made by the selection circuit; and an attenuation circuit, the attenuation circuit being coupled to the output signal of the selection circuit and selectively attenuating the output signal of the selection circuit in response to the comparison made by the selection circuit, the attenuation circuit providing a radiation monitor output signal.

2. An electromagnetic field radiation monitor as defined by claim 1, wherein the selection circuit includes a comparator, the comparator receiving the low power output signal from the diode detector and comparing the low power output signal to the predetermined threshold signal, the comparator providing an output signal having a first state when the low power output signal is less than the threshold signal, and a second state when the low power output signal is at least equal to the threshold signal.

3. An electromagnetic field radiation monitor as defined by claim 2, wherein the selection circuit further includes a relay, the relay being coupled to the comparator and being responsive to the output signal of the comparator, the relay having a first switching circuit, the first switching circuit including first and second poles and a wiper selectively connected to one of the first and second poles, the low power output signal and the high power output signal being respectively provided to the first and second poles, the relay being in a first state such that the first pole and wiper are interconnected when the comparator is in the comparator first state, and being in a second state such that the second pole and wiper are interconnected when the comparator is in the comparator second state.

4. An electromagnetic field radiation monitor as defined by claim 1, which further comprises a temperature compensating amplifier, the temperature compensating amplifier being coupled to the selection circuit and being responsive to the output signal of the selection circuit, the temperature compensating amplifier providing a temperature compensated output signal in response to the selection circuit output signal.

5. An electromagnetic field radiation monitor as defined by claim 1, which further comprises a square root circuit, the square root circuit being coupled to the selection circuit and receiving the output signal of the selection circuit, the square root circuit providing an output signal which varies in accordance with the square root of the selection circuit output signal.

6. An electromagnetic field radiation monitor as defined by claim 3, wherein the relay includes a second switching circuit, the second switching circuit being coupled to the attenuation circuit, the attenuation circuit providing attenuation to the output signal of the selection circuit when the relay is in the first state.

7. An electromagnetic field radiation monitor as defined by claim 6, wherein the attenuation circuit includes a first resistor and a second resistor interconnected in series to form a resistor divider network, the first resistor being responsive to the output signal of the selection circuit, and the radiation monitor output signal being provided on the interconnection between the first resistor and the second resistor, the second switching circuit of the relay being coupled in parallel with the first resistor to short out the first resistor when the relay is in the second state.

8. An electromagnetic field radiation monitor as defined by claim 1, which further comprises first and second amplifiers, the first amplifier being interposed between the low power output of the diode detector and the selection circuit, and the second amplifier being interposed between the high power output of the diode detector and the selection circuit, the first and second amplifiers being respectively responsive to the low power output signal and the high power output signal of the diode detector and providing amplified output signals in response thereto.

9. An electromagnetic field radiation monitor as defined by claim 1, which further includes a shunt resistor and a bypass capacitor for shaping the frequency response of the diode detector, the shunt resistor and bypass capacitor being connected in a series arrangement, one end of the series arrangement of the shunt resistor and bypass capacitor being electrically coupled to the anode of the first diode and the other end of the series arrangement being electrically coupled to the anode of the second diode.

10. An electromagnetic field radiation monitor as defined by claim 1, wherein the total capacitance of the parallel combination of the first capacitor and the first diode is about ten times the shunt capacitance of the second diode.

* * * * *